(12) United States Patent
Guo et al.

(10) Patent No.: US 8,900,935 B2
(45) Date of Patent: Dec. 2, 2014

(54) DEPOSITION ON A NANOWIRE USING ATOMIC LAYER DEPOSITION

(75) Inventors: Dechao Guo, Wappingers Falls, NY (US); Zhengwen Li, Danbury, CT (US); Kejia Wang, Fishkill, NY (US); Zhen Zhang, Ossining, NY (US); Yu Zhu, West Harrison, NY (US)

(73) Assignee: International Business Machines Corporation, Armonk, NY (US)

( * ) Notice: Subject to any disclaimer, the term of this patent is extended or adjusted under 35 U.S.C. 154(b) by 983 days.

(21) Appl. No.: 13/013,067

(22) Filed: Jan. 25, 2011

(65) Prior Publication Data

US 2012/0187375 A1    Jul. 26, 2012

(51) Int. Cl.

| | |
|---|---|
| H01L 29/775 | (2006.01) |
| H01L 21/336 | (2006.01) |
| H01L 51/05 | (2006.01) |
| H01L 29/78 | (2006.01) |
| B82Y 40/00 | (2011.01) |
| H01L 29/66 | (2006.01) |
| H01L 29/06 | (2006.01) |
| H01L 27/12 | (2006.01) |
| H01L 29/47 | (2006.01) |
| H01L 21/84 | (2006.01) |
| B82Y 30/00 | (2011.01) |
| H01L 51/00 | (2006.01) |

(52) U.S. Cl.
CPC ......... *H01L 29/0673* (2013.01); *H01L 51/0048* (2013.01); *H01L 51/057* (2013.01); *H01L 29/7839* (2013.01); *B82Y 40/00* (2013.01); *H01L 29/6675* (2013.01); *H01L 51/0558* (2013.01); *H01L 27/1211* (2013.01); *H01L 29/47* (2013.01); *H01L 21/845* (2013.01); *H01L 51/0516* (2013.01); *B82Y 30/00* (2013.01); *Y10S 977/762* (2013.01); *Y10S 977/938* (2013.01)
USPC .............. 438/151; 257/24; 977/762; 977/938

(58) Field of Classification Search
CPC .............. H01L 21/845; H01L 27/1211; H01L 29/0673; H01L 51/0048; H01L 27/1203; H01L 29/42392; H01L 29/785
See application file for complete search history.

(56) References Cited

U.S. PATENT DOCUMENTS

| | | | |
|---|---|---|---|
| 5,497,019 A | 3/1996 | Mayer et al. ................... | 257/347 |
| 7,253,060 B2 | 8/2007 | Yun et al. ........................ | 438/284 |
| 2008/0014689 A1* | 1/2008 | Cleavelin et al. .............. | 438/197 |
| 2008/0045011 A1 | 2/2008 | Fuller et al. .................... | 438/669 |

(Continued)

OTHER PUBLICATIONS

"Nanowire", http://en.wikipedia.org/wiki/Nanowire (accessed Sep. 7, 2009; 6pp).

(Continued)

*Primary Examiner* — Ha Tran T Nguyen
*Assistant Examiner* — Raj R Gupta
(74) *Attorney, Agent, or Firm* — Harrington & Smith; Louis J. Percello

(57) ABSTRACT

In one exemplary embodiment, a method includes: providing a semiconductor device having a substrate, a nanowire, a first structure and a second structure, where the nanowire is suspended between the first structure and the second structure, where the first structure and the second structure overly the substrate; and performing atomic layer deposition to deposit a film on at least a portion of the semiconductor device, where performing atomic layer deposition to deposit the film includes performing atomic layer deposition to deposit the film on at least a surface of the nanowire.

20 Claims, 11 Drawing Sheets

(56) References Cited

U.S. PATENT DOCUMENTS

| | | | |
|---|---|---|---|
| 2008/0305437 A1 | 12/2008 | Fuller et al. | 430/319 |
| 2010/0133509 A1 | 6/2010 | Kawashima et al. | 257/24 |
| 2010/0155786 A1 | 6/2010 | Heald et al. | 257/213 |
| 2010/0163850 A1 | 7/2010 | Chae et al. | 257/24 |
| 2010/0164110 A1 | 7/2010 | Jin et al. | 257/757 |
| 2010/0167504 A1 | 7/2010 | Anderson et al. | 438/478 |
| 2010/0193770 A1 | 8/2010 | Bangsaruntip et al. | 257/24 |
| 2010/0207208 A1 | 8/2010 | Bedell et al. | 257/346 |

OTHER PUBLICATIONS

"Dopant-Segregated Schottky Silicon-Nanowire MOSFETs With Gate-All-Around Channels", Yoke King Chin, et al., IEEE Electron Device Letters, vol. 30, No. 8, Aug. 2009, p. 843-845 (3 pp.).

"A Compact Model for Undoped Silicon-Nanowire MOSFETs with Schottky-Barrier Source/Drain", Guojun Zhu et al., IEEE Transactions On Electron Devices, vol. 56, No. 5, May 2009, p. 1100-1109 (10 pp.).

"Improved carrier injection in gate-all-around Schottky barrier silicon nanowire field-effect transistors", J. W. Peng et al., American Institute of Physics Applied Physics Letters 93, 073503, 2008, (3 pp.).

"Silicon nanowire NVM cell using high-k dielectric charge storage layer", X. Zhu et al., Microelectronic Engineering 85, 2008, p. 2403-2405 (3 pp.).

"ALD High-k as a Common Gate Stack Solution for Nano-electronics", P.D. Ye et al., ECS Transactions, 28 (2), 2010, p. 51-68 (18 pp.).

"Guest Editorial Special Issue on Nanowire Transistors: Modeling, Device Design, and Technology", IEEE Transactions on Electron Devices, vol. 55, No. 11, Nov. 2008, p. 2813-2815 (3 pp.).

"Memristive Devices Fabricated with Silicon Nanowire Schottky Barrier Transistors", Davide Sacchetto et al., IEEE 978-14244-5309-2/10, 2010, p. 9-12 (4 pp.).

"IBM Makes Silicon Nanowire Transistors with 2.6 nanometer Features", http://nextbigfuture.com/2010/06/ibm-makes-silicon-nanowire-transistors.html; Jun. 2, 2010 (2 pp.).

"IBM makes oscillator from nanowire transistors", Peter Clarke, EE Times News & Analysis, Jun. 1, 2010 (2 pp.).

"Extracting Mobility Degradation and Total Series Resistance of Cylindrical Gate-All-Around Silicon Nanowire Field-Effect Transistors", Luryi Choi et al., IEEE Electron Device Letters, vol. 30, No. 6, Jun. 2009, p. 665-667 (3 pp.).

"Externally Assembled Gate-All-Around Carbon Nanotube Field-Effect Transistor", Zhihong Chen et al., IEEE Electron Device Letters, vol. 29, No. 2, Feb. 2008, p. 183-185 (3 pp.).

"Electron Tomography of Gate-All-Around Nanowire Transistors", P.D. Cherns et al., 2010 J. Phys.: Conf. Ser. 209 012046, 2010 (4 pp.).

"Simulation of Silicon Nanowire Transistors Using Boltzmann Transport Equation Under Relaxation Time Approximation", Seonghoon Jin et al., IEEE Transactions on Electron Devices, vol. 55, No. 3, Mar. 2008, p. 727-736 (10 pp.).

"Design Optimization of Gate-All-Around (GAA) MOSFETs", Jae Young Song, et al., IEEE Transactions on Nanotechnology, vol. 5, No. 3, May 2006, p. 186-191 (6 pp.).

"Characterization and Reliability of Gate-All-Around Poly-Si TFTs With Multi-Nanowire Channels", Han-Wen Liu et al. 218th Electrochemical Society Meeting, 2010 (1 pp.).

"Silicon-On-Insulator 'Gate-All-Around Device'", J. P. Colinge, et al., IEEE CH2865-4/90/0000-0595, 1990 (4 pp.).

"Gate-All-Around Silicon Nanowire MOSFETs on Bulk Substrate", Jin-Woo Han et al., 2009, p. 648-649 (2 pp.).

\* cited by examiner

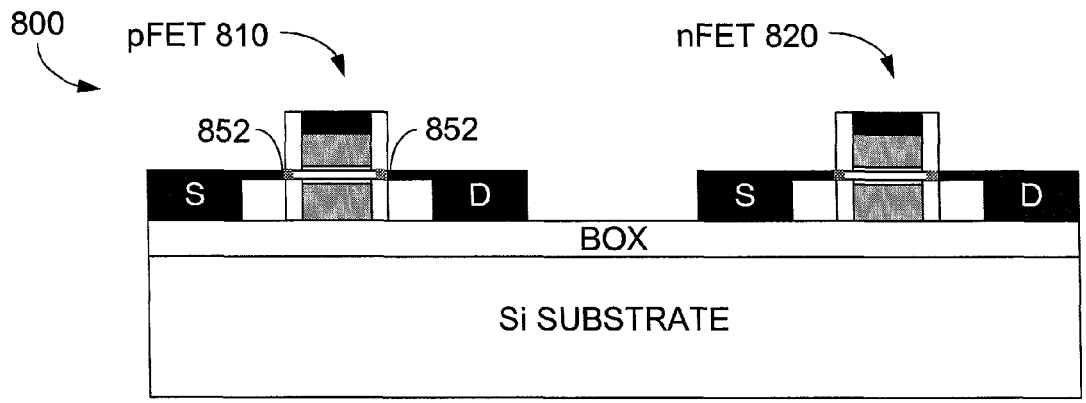

FIG. 18

```
┌─────────────────────────────────────────┐
│  PROVIDING A SEMICONDUCTOR DEVICE       │
│  COMPRISING A SUBSTRATE, A NANOWIRE, A FIRST │─ 901
│  STRUCTURE AND A SECOND STRUCTURE, WHERE│
│  THE NANOWIRE IS SUSPENDED BETWEEN THE FIRST │
│  STRUCTURE AND THE SECOND STRUCTURE, WHERE │
│  THE FIRST STRUCTURE AND THE SECOND     │
│  STRUCTURE OVERLY THE SUBSTRATE         │
└─────────────────────────────────────────┘
                    │
                    ▼
┌─────────────────────────────────────────┐
│  PERFORMING ATOMIC LAYER DEPOSITION TO  │
│  DEPOSIT A FILM ON AT LEAST A PORTION OF THE │─ 902
│  SEMICONDUCTOR DEVICE, WHERE PERFORMING │
│  ATOMIC LAYER DEPOSITION TO DEPOSIT THE FILM │
│  COMPRISES PERFORMING ATOMIC LAYER      │
│  DEPOSITION TO DEPOSIT THE FILM ON AT LEAST A │
│  SURFACE OF THE NANOWIRE                │
└─────────────────────────────────────────┘
```

FIG. 19

DEPOSITION ON A NANOWIRE USING ATOMIC LAYER DEPOSITION

TECHNICAL FIELD

The exemplary embodiments of this invention relate generally to semiconductor structures and, more specifically, relate to deposition on a nanowire structure.

BACKGROUND

This section endeavors to supply a context or background for the various exemplary embodiments of the invention as recited in the claims. The content herein may comprise subject matter that could be utilized, but not necessarily matter that has been previously utilized, described or considered. Unless indicated otherwise, the content described herein is not considered prior art, and should not be considered as admitted prior art by inclusion in this section.

Semiconductors and integrated circuit chips have become ubiquitous within many products due to their continually decreasing cost and size. hi the microelectronics industry as well as in other industries involving construction of microscopic structures (e.g., micromachines, magnetoresistive heads, etc.) there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at or approaching atomic level scaling of certain micro-devices such as logic gates, field effect transistors (FETs) and capacitors, for example. Circuit chips with hundreds of millions of such devices are not uncommon.

Basically, a FET is a transistor having a source, a gate, and a drain. The action of the FET depends on the flow of majority carriers along a channel between the source and drain that runs past the gate. Current through the channel, which is between the source and drain, is controlled by the transverse electric field under the gate. As known to those skilled in the art, P-type FETs (pFETs) turn ON to allow current flow from source to drain when the gate terminal is at a low or negative potential with respect to the source. When the gate potential is positive or the same as the source, the P-type FET is OFF, and does not conduct current. On the other hand, N-type FETs (nFETs) turn ON to allow current flow from source to drain when the gate terminal is high or positive with respect to the source. When the gate potential is negative or the same as the source, the N-type FET is OFF, and does not conduct current. Note that in each of these cases there is a threshold voltage (e.g., at the gate terminal) for triggering actuation of the FET. More than one gate (multi-gate FETs) can be used to more effectively control the channel.

As transistors have become smaller in size and the currents they convey become commensurately smaller, it has become more important to control for current leakage by disposing the gate on more than simply the top surface of the channel, as was done with early transistors. As such, more effective gate control can be obtained by disposing the gate fully about the cross-sectional profile of the channel to form a gate-all-around (GAA) transistor.

Nanotechnology has gained widespread use in the semiconductor industry as a way to meet scaled technology requirements. One-dimensional nanostructures such as silicon nanowires (SNW) are attractive building blocks for assembly of nanoelectronic and nanophotonic systems. Nanowires are particularly attractive because their electronic and optical properties can be tailored by controlling their diameter through synthesis.

Semiconductor nanowires have been utilized to construct various devices including, for example, FETs, complementary metal-oxide semiconductor (CMOS) FETs, logic gates, sensors, photodiodes and lasers. In particular, semiconducting nanostructures (e.g., nanowires and nanocrystals) can be used as the "channel" material in a FET. One common method of fabricating a nanostructure FET deposits the nanostructure on a substrate (e.g., an oxide thin film) from a liquid suspension. Source and drain contacts are then formed lithographically on the nanostructure.

Nanowires can be formed from semiconductor materials including, for example, Si, SiGe, a III-V compound semiconductor, or a carbon nanotube (CNT) for use in the active channel area. Such nano-channels may be patterned with a conventional "top down" lithographic patterning technique or from a "bottom up" process with nanowire or CNT deposition atop a semiconductor substrate (e.g., Si, SiGe, a Silicon-on-insulator, a semiconductor-on-insulator (SOI) or a silicon germanium-on-insulator (SGOI)) followed by conventional gate patterning such as those outlined in U.S. Patent Application Publication No. 2008/0305437 and U.S. Patent Application Publication No. 2008/0045011 or other methodologies.

FIG. 1 shows a cross-section of an exemplary GAA Schottky junction source/drain FET 110 having a nanowire channel 120. The FET 110 is embodied within a semiconductor structure 100 that comprises the FET 110 disposed over a buried oxide layer (BOX) 102. The FET 110 has a nanowire (NW) channel 112 connected to a silicided source region 114 and a silicided drain region 116. The FET 110 further includes a gate structure 120 that surrounds the NW 112 (e.g., at least a portion thereof). The gate structure 120 may comprise a gate stack 122 having one or more layers that comprise one or more dielectric materials, one or more metals and/or one or more insulating layers (e.g., an oxide). In some cases, the NW 112 is enveloped (within the gate structure 120) by an interstitial layer of gate oxide 124 to enhance electrical coupling of the gate stack 122 to the channel (the NW 112). The gate structure 120 further includes a cap 126 (e.g., a silicided cap) and one or more spacers 128. The BOX 102 may overly one or more further layers, such as a semiconductor layer (not shown). As an example, the FET 110 may be formed over a SOI substrate with the top semiconductor layer being used to form the source 114 region, drain 116 region and/or channel (NW) 112 of the FET 110.

The GAA structure has potential for improving performance of extremely-scaled FETs. In addition, Schottky junction source/drain technology may enable reduction of the parasitic source/drain resistance.

BRIEF SUMMARY

In one exemplary embodiment of the invention, a method comprising: providing a semiconductor device comprising a substrate, a nanowire, a first structure and a second structure, where the nanowire is suspended between the first structure and the second structure, where the first structure and the second structure overly the substrate; and performing atomic layer deposition to deposit a film on at least a portion of the semiconductor device, where performing atomic layer deposition to deposit the film comprises performing atomic layer deposition to deposit the film on at least a surface of the nanowire.

In another exemplary embodiment of the invention, a semiconductor device comprising a substrate, a nanowire, a first structure and a second structure, where the nanowire is suspended between the first structure and the second structure, where the first structure and the second structure are disposed on a substrate, where the semiconductor structure is formed in accordance with a process comprising: performing atomic layer deposition to deposit a film at least on a surface of the nanowire; and performing a heat treatment on the semiconductor device to form a layer on at least a portion of the nanowire, where the layer comprises silicide or carbide, where the layer substantially evenly coats the at least a portion of the nanowire.

In a further exemplary embodiment of the invention, a semiconductor device comprising: a substrate; a nanowire; a first structure; and a second structure, where the nanowire is suspended between the first structure and the second structure, where the first structure and the second structure overly the substrate, where the nanowire comprises a layer on a surface of the nanowire, where the layer comprises at least one of silicide and carbide, where the layer has a substantially uniform shape.

BRIEF DESCRIPTION OF THE SEVERAL VIEWS OF THE DRAWINGS

The foregoing and other aspects of embodiments of this invention are made more evident in the following Detailed Description, when read in conjunction with the attached Drawing Figures, wherein:

FIGS. 14-18 illustrate a second exemplary process flow for a CMOS device in accordance with the exemplary embodiments of the invention;

FIG. 19 depicts a flowchart illustrating one non-limiting example of a method for practicing the exemplary embodiments of this invention;

DETAILED DESCRIPTION

It is desirable to reduce the resistance of the nanowire linking the source/drain pads and the channel. In furtherance of this goal, one can form a silicide on the nanowire, for example, by sputtering or evaporating a metal onto the nanowire and subsequently performing an anneal (e.g., a rapid thermal anneal or RTA).

Figure 2:
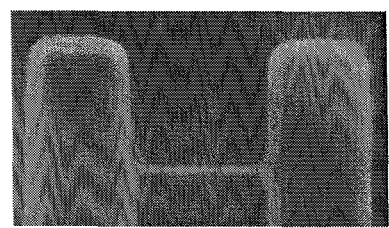
FIG. 2 shows an exemplary Si nanowire suspended between two pads.
Figure 3:
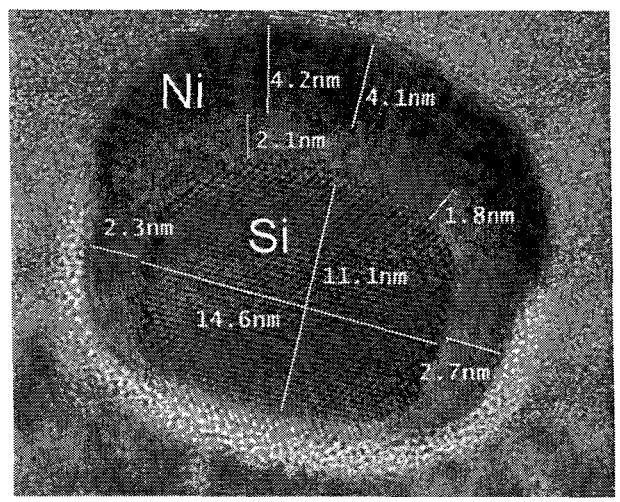
FIG. 3 shows a transmission electron microscope cross-section for Ni film coverage on a suspended Si nanowire as deposited with sputtering.

FIG. 2 shows an exemplary Si nanowire suspended between two pads (e.g., contacts, source/drain pads). When a metal film is sputtered or evaporated to a suspended Si nanowire (such as the one shown in FIG. 2) for the silicidation process, it is very difficult to obtain full coverage (e.g., completely surrounding the nanowire). As a result, when silicide is formed from sputtering or evaporating Ni onto a suspended Si nanowire, two situations commonly arise. FIG. 3 shows a transmission electron microscope (TEM) cross-section for Ni film coverage on a suspended Si nanowire as deposited with sputtering (i.e., before RTA and formation of silicide). If the Ni coverage is insufficient (e.g., for the bottom of the Si nanowire shown in FIG. 3 where the Si remains exposed), this portion of the Si nanowire will not be silicided. If there is a greater amount of Ni than that which is needed (e.g., at the top of the Si nanowire shown in FIG. 3), the additional Ni may form Ni$_2$Si (i.e., instead of the desired phase of NiSi, which has lower resistivity).

Figure 4:
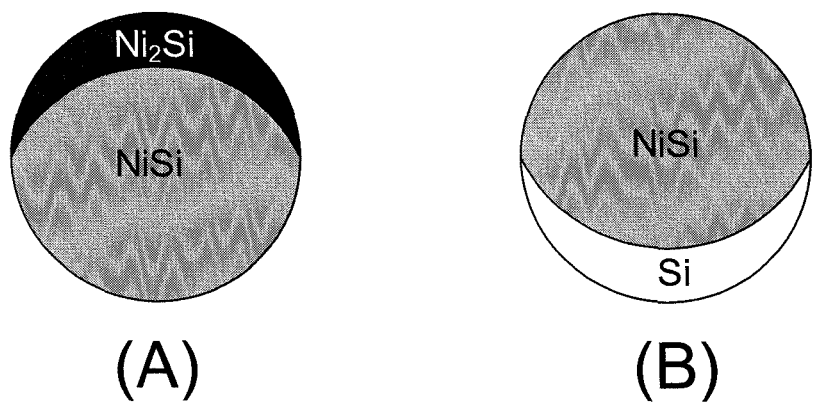
FIG. 4 shows two cross-sections of an exemplary suspended Si nanowire after silicidation with sputtering or evaporating Ni on a suspended nanowire.

FIG. 4 shows two cross-sections of an exemplary suspended Si nanowire after silicidation (e.g., depositing the Ni and treating with a RTA) with sputtering or evaporating Ni onto the suspended Si nanowire (e.g., to form silicide) and is further illustrative of these two situations. As shown in FIG. 4A, too much Ni may be deposited on the top and the nanowire may have a cross-section of Ni$_2$Si/NiSi. As shown in FIG. 4B, too little Ni may be deposited on the bottom and the nanowire may have a cross-section of NiSi/unreacted Si. The two situations are not independent and it is possible for a single nanowire to experience both of these conditions.

The poor coverage of the nanowire may lead to various problems or complications. For example, the two different silicide phases in the nanowire may cause stress related issues because of the volume expansion difference during the reaction. As another example, and with reference to FIG. 4B, the unreacted Si at the bottom of the nanowire may cause a loss in effective gate width (e.g., because a lower portion of the conducting channel will not be connected by the silicide).

To set the correct work function for the source/drain regions, ion implantation into the source/drain regions and/or into the silicide may be needed to induce dopant-segregation. The tail of the ion implantation may cause degradation of the short channel effect control.

Figure 1:
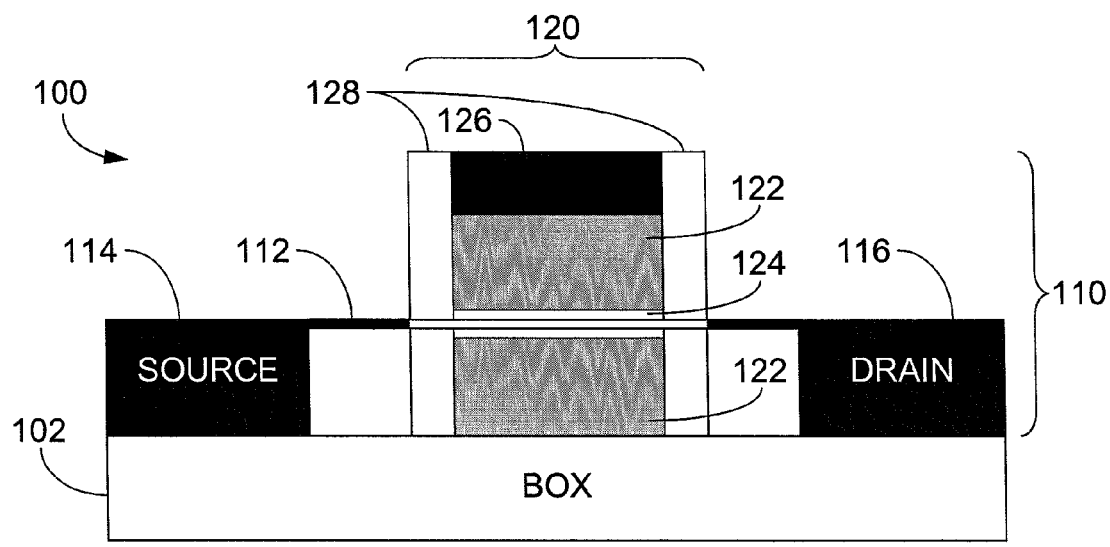
FIG. 1 shows a cross-section of an exemplary gate-all-around Schottky junction source/drain field effect transistor having a nanowire channel.
Figure 5:
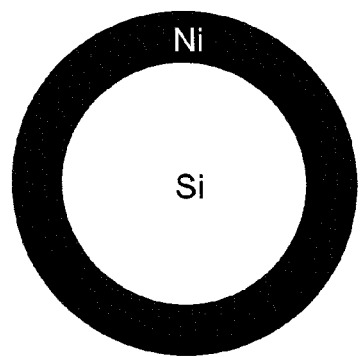
FIG. 5 shows a cross-section of an exemplary Si nanowire after using atomic layer deposition to deposit Ni on the nanowire to form silicide.

The exemplary embodiments of the invention seek to address these and other issues by utilizing atomic layer deposition (ALD) to ensure a conformal surrounding coverage of metal around the nanowire. In view of the improved coverage, the exemplary embodiments of the invention enable better control over the silicide process, leading to improved properties of the resulting device(s). FIG. 5 shows a cross-section of an exemplary Si nanowire after using ALD to deposit Ni on the nanowire to form silicide. As can be appreciated, and in comparison to FIGS. 3 and 4, the coverage afforded by the exemplary embodiments of the invention is more uniform and more complete than the coverage obtained using the prior art techniques of sputtering and/or evaporating, for example.

As non-limiting examples, there are two techniques that may be used to segregate the dopants (e.g., at the silicide-Si interface; at the edge of a gate structure that encloses a portion of the Si nanowire) of a nanowire. With a first technique, ion implantation into the silicide is followed by a low temperature drive-in anneal. With a second technique, different dopants are added into the ALD precursors to effect in-situ doped metal deposition (e.g., Ni—B/Al for pFETs or Ni—As/P for nFETs). The dopants are segregated, for example, at the silicide-Si interface during the silicide process, thus releasing or reducing the demands on the source/drain implantation(s).

As utilized herein, a "nanowire" is considered to be a wire-shaped structure (e.g., a shape where the length is much greater than the thickness or diameter, resembling a one-dimensional structure) having a thickness or diameter constrained to tens of nanometers or less. More commonly, and as a non-limiting example, nanowires have a thickness or diameter less than 10 nm. As non-limiting examples, nanowires may have a circular, cylindrical or rectangular cross-section. Typical nanowires exhibit length-to-width ratios of 1000 or more, for example. A "suspended nanowire" is considered to be a nanowire that is held at the longitudinal extremes (e.g., over a surface or other object). As non-limiting examples, suspended nanowires can be produced by chemically etching or bombarding (e.g., with highly energetic ions) a larger wire or by indenting the tip of a scanning tunneling microscope (STM) in the surface of a metal near its melting point and then retracting the tip of the STM.

Chemical vapor deposition (CVD) is a chemical process designed to produce high-performance solid materials used in semiconductor processing. Typically, CVD techniques expose a substrate to one or more volatile precursors that decompose and/or react on the surface of the substrate to produce the deposited material. By-products may be produced and, subsequently, removed via gas flow through the reaction chamber. As non-limiting examples, CVD may be used to deposit layers of polysilicon, $SiO_2$, $Si_3N_4$, SiNH, $HfO_2$, Mo, Ta, Ti, TiN and W.

ALD is another thin film deposition technique. ALD uses precursors (chemicals) that react with the surface separately in a sequential manner. A thin film is deposited by repeatedly exposing the precursors to the substrate. While similar in chemistry to CVD, ALD breaks the CVD reaction into two or more half-reactions, maintaining the precursors separately during the overall ALD process. ALD enables atomic scale deposition control and can achieve growth on the order of 0.2-1.5 Å per cycle, as a non-limiting example. Separation of the precursors may be obtained by utilizing a purge gas (e.g., N, Ar) after each precursor to remove excess precursor from the process chamber and reduce or prevent parasitic CVD processes (e.g., extra deposition on the substrate via CVD). As non-limiting examples, ALD may be used to deposit layers of Ni, $Al_2O_3$, $TiO_2$, $SnO_2$, ZnO, $HfO_2$, TiN, TaN, WN, NbN, Ru, Ir, Pt and ZnS.

ALD and CVD processes may be used for depositing high-K dielectric films. As compared ALD, CVD processes are generally lower cost predominantly due to greater throughput. In contrast, ALD processes are generally considered superior because of lower impurity content, better conformality and better uniformity of the films.

As a non-limiting example, an ALD process may deposit conformal layers of material by repeating the following four steps: (1) expose the substrate to the first precursor; (2) purge or evacuate the reaction chamber to remove by-products and any non-reacted first precursor; (3) expose the substrate to the second precursor (or use a treatment to activate the surface for a reaction of the first precursor); and (4) purge or evacuate the chamber to remove by-products and any non-reacted second precursor. Each reaction cycle deposits an amount of material on the surface, referred to as the growth per cycle. The reaction cycles are repeated to achieve a desired thickness. An individual cycle may typically deposit less than 3-5 Å of film (e.g., on the order of 0.2-1.5 Å per cycle). In other cases, an ALD process may include additional steps such as: (5) expose the substrate to a flash treatment (e.g., for in-situ doping); and (6) purge or evacuate the chamber to remove by-products and any non-reacted flash materials.

Below is described an exemplary ALD process with exemplary ALD materials and compounds. In other exemplary embodiments, a different process, different precursor and/or different materials may be utilized. In some exemplary embodiments, the process, characteristics of the process (e.g., temperatures, time, number of cycles, etc.) and/or materials may be chosen or selected based on a composition of the nanowire, a type and/or composition of material (e.g., metal) to be deposited, doping (e.g., doping profile, dopants, concentration(s), etc.), and/or deposition rate, as non-limiting examples.

Figure 6:
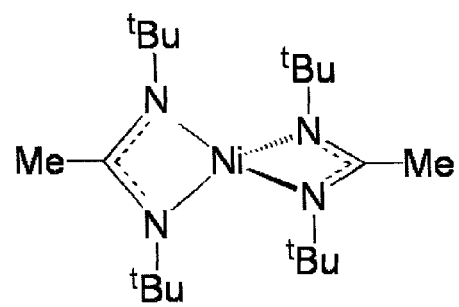
FIG. 6 shows a chemical diagram of Ni(t-Bu-amidinate)$_2$.

The exemplary ALD reaction uses a Ni precursor of Ni(t-Bu-amidinate)$_2$. FIG. 6 shows a chemical diagram of Ni(t-Bu-amidinate)$_2$. The chemical reaction for the ALD is:

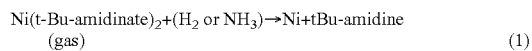

$$Ni(t\text{-Bu-amidinate})_2 + (H_2 \text{ or } NH_3) \rightarrow Ni + tBu\text{-amidine (gas)} \qquad (1)$$

The precursor temperature is about 100° C. The deposition temperature is in the range of about 250° C. to about 300° C. The deposition rate is approximately 0.2 Å per cycle. One ALD cycle involves at least four steps performed in sequence: (1) expose the nanowire to the Ni precursor; (2) purge the ALD chamber with an inert gas; (3) expose the nanowire to $H_2$ or $NH_3$; and (4) purge the ALD chamber with an inert gas (e.g., the same inert gas or a different inert gas).

If in-situ doping is desired, it can be effected by introducing suitable flash layers or flash treatments in the process. For example, a single ALD cycle may further comprise the following additional steps (e.g., performed after steps 1-4 above): (5) $B_2H_6$ or $PH_3$ flash treatment; and (6) purge the ALD chamber with an inert gas.

Steps 1-4 or steps 1-6 may be repeated a suitable number of times in order to reach a desired thickness or at least a minimum thickness for the Ni film. Subsequently, the structure undergoes an anneal (e.g., a RTA), for example, performed at about 550° C. for 5 minutes. The anneal forms a silicide from the deposited Ni film. As a non-limiting example, this process may be used to form a NiSi film/silicide with a thickness of about 20 nm and having a resistivity of about 30 micro-ohms per cm.

For purposes of convenience and illustration, when describing FIGS. 7-18 the CMOS devices 700, 800 will be referred to as containing a single pFET and a single nFET. It should be understood that in other exemplary embodiments the CMOS devices 700, 800 may include any suitable number of pFETs, nFETs and/or other devices and structures. One of ordinary skill in the art will appreciate the various arrangements and combinations of devices that are possible.

Figure 7:
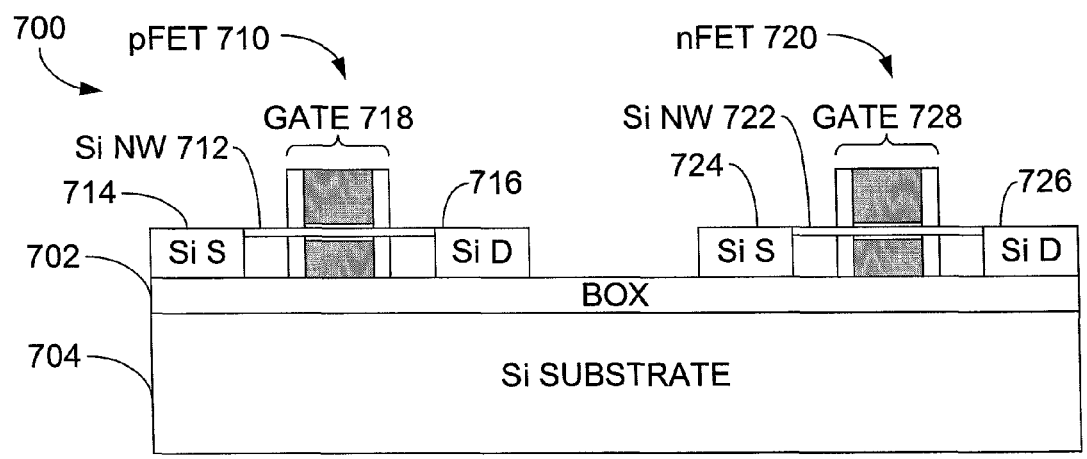
FIGS. 7-13 illustrate a first exemplary process flow for a CMOS device in accordance with the exemplary embodiments of the invention.

FIGS. 7-13 illustrate a first exemplary process flow for a CMOS device 700 in accordance with the exemplary embodiments of the invention. As shown in FIG. 7, the CMOS device 700 includes at least one pFET 710 and at least one nFET 720, both disposed/patterned on an insulating layer (e.g., a buried oxide layer, BOX 702) overlying a Si substrate 704 (e.g., collectively forming a Silicon-on-insulator substrate, in conjunction with the source/drains, from which the CMOS device 700 was formed). The pFET 710 includes a Si nanowire channel (NW) 712 suspended between a Si source (Si S) 714 and a Si drain (Si D) 716. At least a portion of the NW 712 is surrounded by a GAA gate (GATE) 718. Similarly, the nFET 720 includes a Si nanowire channel (NW) 722 suspended between a Si source (Si S) 724 and a Si drain (Si D) 726. At least a portion of the NW 722 is surrounded by a GAA gate (GATE) 728.

Figure 8:
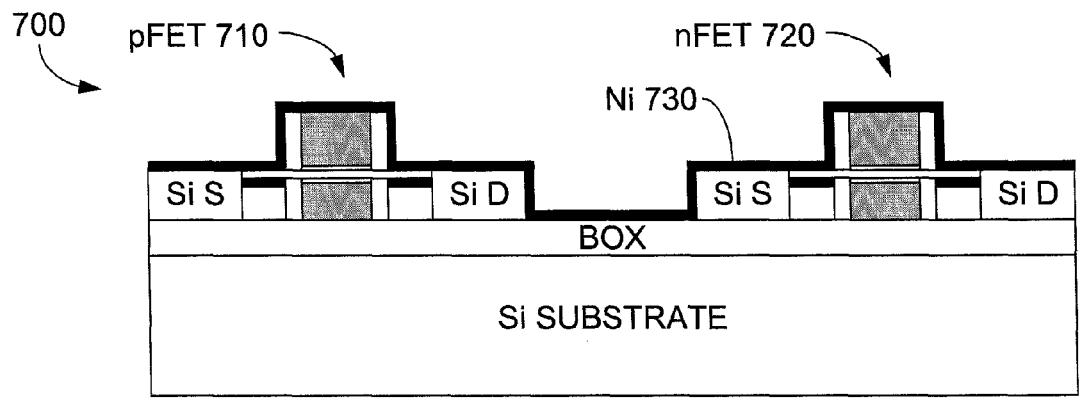
Figure 9:
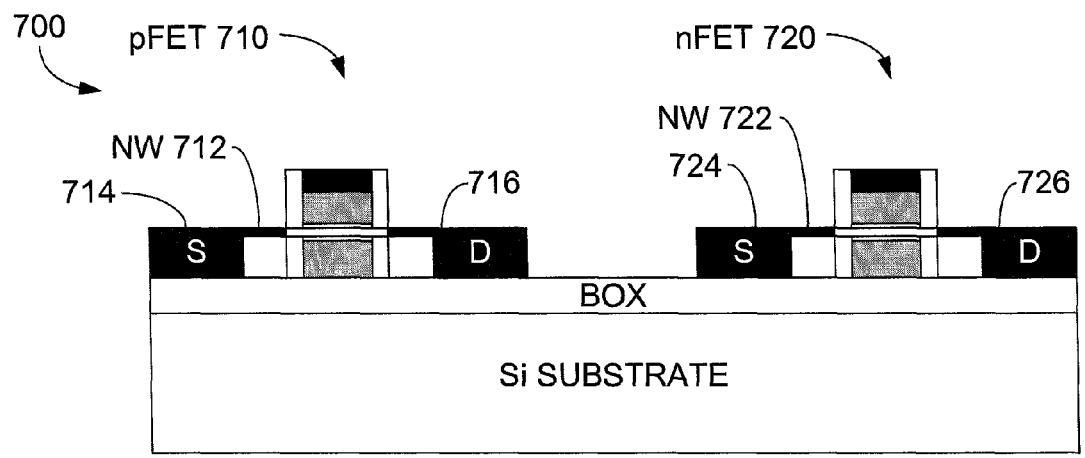

A self-aligned silicide process may be used to form silicide on the NWs 712, 722 (e.g., the exposed portions of the NWs 712, 722), the contacts (the sources 714, 724 and the drains 716, 726) and/or the caps of the GATEs 718, 728. As shown in FIG. 8, Ni 730 is deposited over the CMOS device 700 (i.e., over both the pFET 710 and the nFET 720) using ALD. The deposited Ni 730 is undoped, substantially undoped or doped with a dopant that is desirable for both pFETs and nFETs. The CMOS device 700 is subject to a heat treatment, such as a RTA, for example, in order to form silicide. The unreacted Ni is then removed (e.g., stripped), leaving silicide on the NWs 712, 722, the contacts 714, 716, 724, 726 (see FIG. 9) and/or the caps of the GATEs 718, 728.

Figure 10:
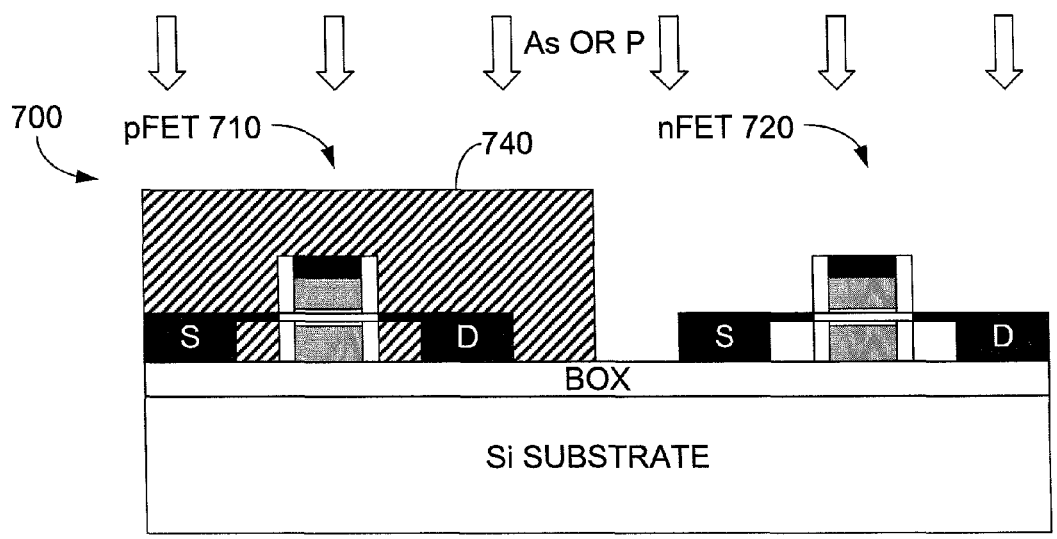
Figure 11:
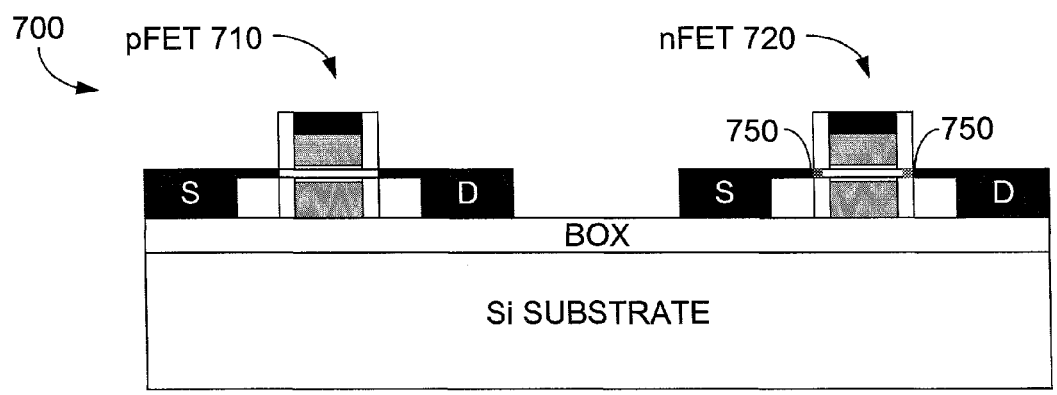
Figure 12:
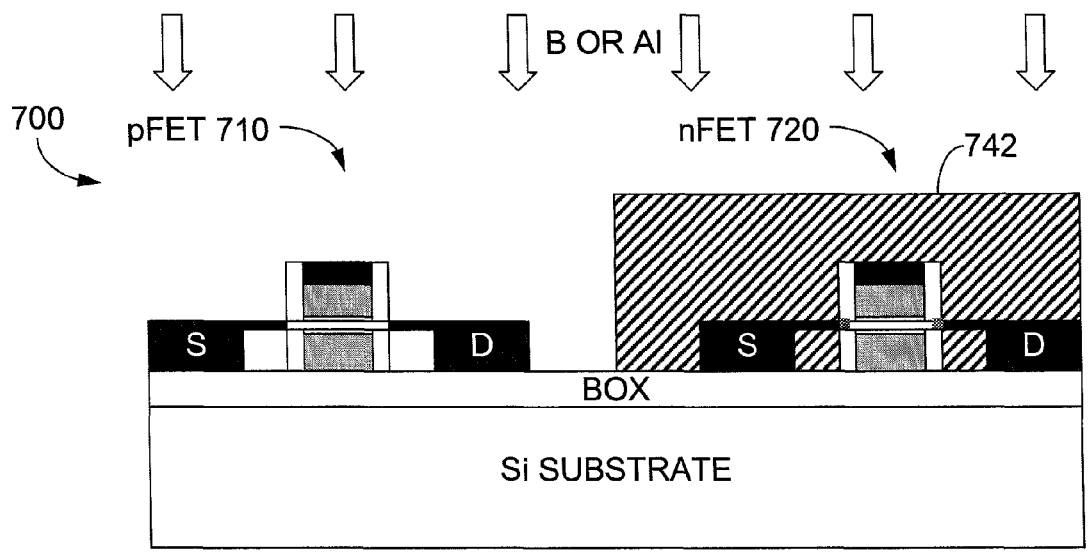
Figure 13:
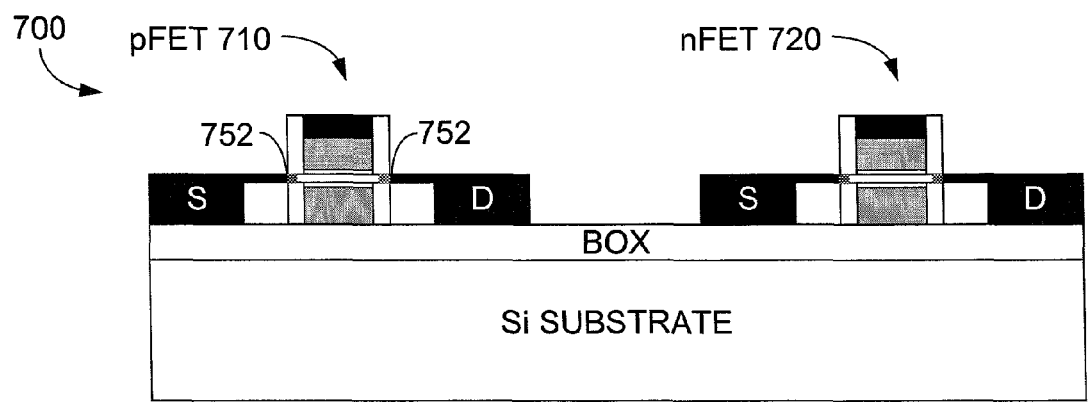

As shown in FIGS. 10-13, the silicide of the pFET 710 and the nFET 720 may be doped separately with different dopants (e.g., the pFET 710 is doped with one or more dopants desirable for a pFET while the nFET 720 is doped with one or more dopants desirable for an nFET). To accomplish this, the pFET 710 is masked (e.g., with photoresist 740) while one or more dopants (e.g., As or P) are implanted in the nFET 720 (e.g., in the silicide of the nFET 720), as shown in FIG. 10. Subsequently, the photoresist 740 is removed and a drive-in anneal (not shown) is used to diffuse the dopant(s) to the silicide/Si interface 750, as shown in FIG. 11. A similar process is performed for the pFET. As shown in FIG. 12, the nFET 720 is masked (e.g., with photoresist 742) while one or more dopants (e.g., B or Al) are implanted in the pFET 710 (e.g., in the silicide of the pFET 710). Subsequently, the photoresist 742 is removed and a drive-in anneal (not shown) is used to diffuse the dopant(s) to the silicide/Si interface 752, as shown in FIG. 13. As a non-limiting example, one or more (e.g., both) of the drive-in anneals may comprise a low temperature anneal (e.g., using a temperature at, around or below 700° C.).

Figure 14:
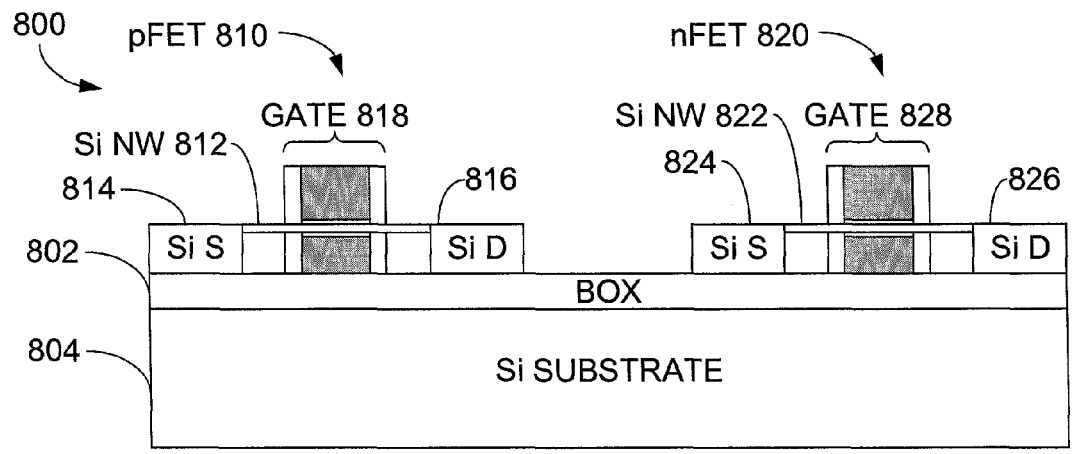

FIGS. 14-18 illustrates a second exemplary process flow for a CMOS device 800 in accordance with the exemplary embodiments of the invention. As shown in FIG. 14, the CMOS device 800 includes at least one pFET 810 and at least one nFET 820, both disposed/patterned on an insulating layer (e.g., a buried oxide layer, BOX 802) overlying a Si substrate 804 (e.g., collectively forming a Silicon-on-insulator substrate, in conjunction with the source/drains, from which the CMOS device 800 was formed). The pFET 810 includes a Si nanowire channel (NW) 812 suspended between a Si source (Si S) 814 and a Si drain (Si D) 816. At least a portion of the NW 812 is surrounded by a GAA gate (GATE) 818. Similarly, the nFET 820 includes a Si nanowire channel (NW) 822 suspended between a Si source (Si S) 824 and a Si drain (Si D) 826. At least a portion of the NW 822 is surrounded by a GAA gate (GATE) 828.

Unlike the first exemplary process illustrated in FIGS. 7-13, the second exemplary process does not perform a separate step to dope the silicide. Instead, at least two separate Ni depositions, using ALD, are performed in order to deposit different dopings of Ni over the pFET 810 and the nFET 820. This is further described immediately below with respect to FIGS. 15-18.

Figure 15:
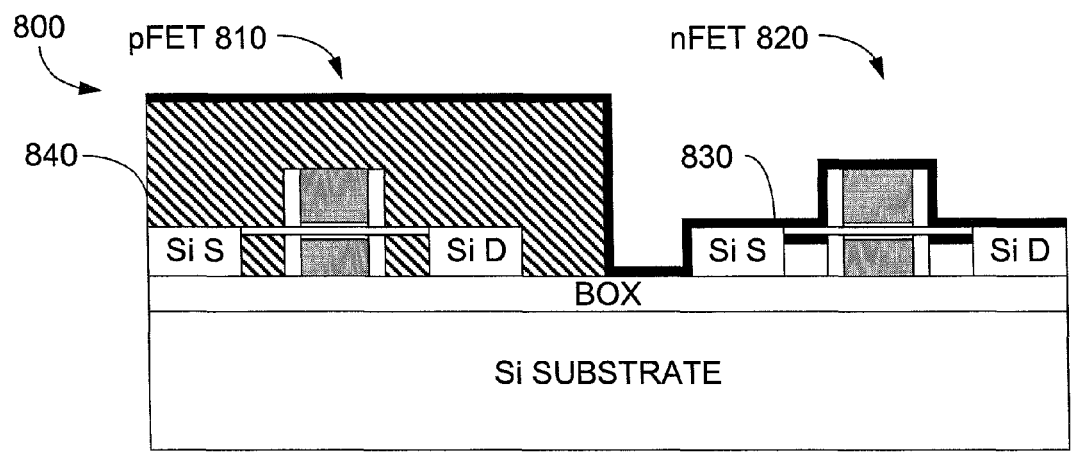
Figure 16:
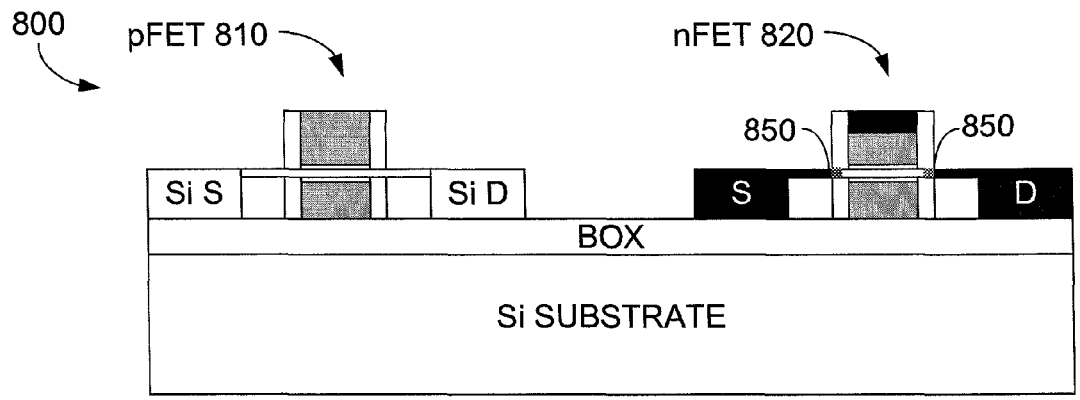

As shown in FIG. 15, the pFET 810 is masked (e.g., with a hardmask 840) while doped Ni 830 is deposited, via ALD, over the nFET 820. As non-limiting examples, the doped Ni 830 may comprise at least one of As and P. A self-aligned silicide process is performed (e.g., RTA followed by removal of the unreacted Ni) to form silicide on the NW 822, the contacts (the source 824 and the drain 826) and/or the cap of the GATE 828 with subsequent removal of the hardmask 840. This results in segregated dopants at the silicide/Si interface 850, as shown in FIG. 16.

Figure 17:
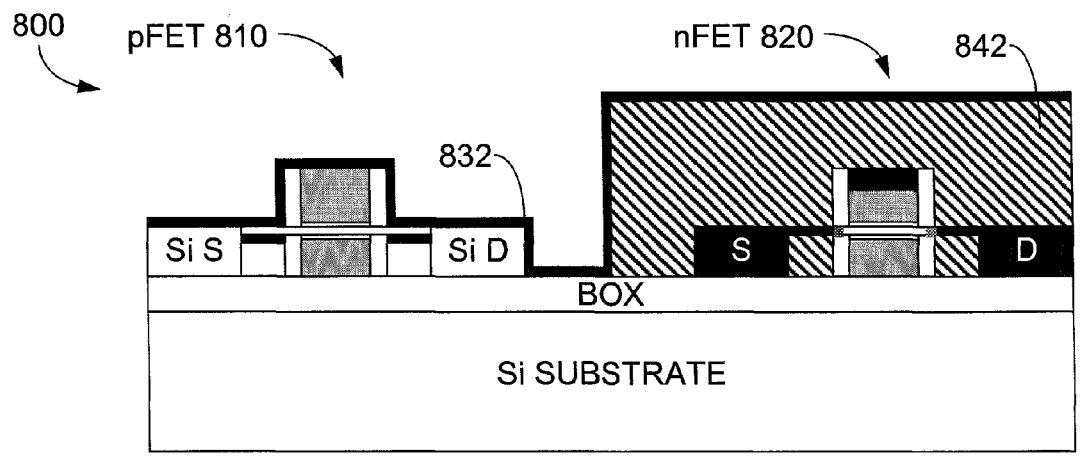

A similar process is performed for the pFET. As shown in FIG. 17, the nFET 820 is masked (e.g., with a hardmask 842) while doped Ni 832 is deposited, via ALD, over the pFET 810. As non-limiting examples, the doped Ni 832 may comprise at least one of B and Al. A self-aligned silicide process is performed (e.g., RTA followed by removal of the unreacted Ni) to form silicide on the NW 812, the contacts (the source 814 and the drain 816) and/or the cap of the GATE 818 with subsequent removal of the hardmask 842. This results in segregated dopants at the silicide/Si interface 852, as shown in FIG. 18. As a non-limiting example, the dopings shown in FIGS. 15-18 may be accomplished by modifying one or more of the precursors for the ALD (e.g., to include the desired one or more dopants or to include materials that react to form the desired one or more dopants).

In other exemplary embodiments, instead of performing two anneals, one after each deposition, a single post-deposition anneal may be used to form the silicide and/or diffuse the dopants. In either case, after the heat treatment(s) any unreacted metal may be removed, for example, using a selective wet etch.

The first and second exemplary process flows, as described above, are provided as examples of techniques for forming differently-doped regions on a CMOS device 700, 800 that includes at least one suspended NW. Further exemplary techniques and variations are available for use in conjunction with the exemplary embodiments of the invention. As a non-limiting example, the exemplary techniques of FIGS. 7-18 may be utilized to form differently-doped materials (e.g., silicides) for devices and/or components other than FETs (e.g., sensors or other devices that include a suspended NW). As a further non-limiting example, different dopants may be utilized. As another non-limiting example, one or more different materials (e.g., other than Ni) may be deposited using these exemplary techniques. As non-limiting examples, the exemplary techniques may be utilized to deposit one or more of: Ni, Pt, Co, Ti, Er, Yb, W, Pd and/or combinations thereof As a further non-limiting example, the exemplary embodiments of the invention may be utilized with different types of NWs. For example, the exemplary techniques may be utilized to deposit Ni on carbon nanotubes in order to form carbide. In some exemplary embodiments, one or more of the NWs is formed using a "top-down" technique. In other exemplary embodiments, one or more of the NWs is formed using a "bottom-up" technique. One of ordinary skill in the art will appreciate that further techniques and variations are available for use in conjunction with the exemplary embodiments of the invention as described herein.

Below are further descriptions of various non-limiting, exemplary embodiments of the invention. The below-described exemplary embodiments are numbered separately for clarity purposes. This numbering should not be construed as entirely separating the various exemplary embodiments since aspects of one or more exemplary embodiments may be practiced in conjunction with one or more other aspects or exemplary embodiments.

(1) In one exemplary embodiment, and as shown in FIG. 19, a method comprising: providing a semiconductor device comprising a substrate, a nanowire, a first structure and a second structure, where the nano wire is suspended between the first structure and the second structure, where the first structure and the second structure overly the substrate (901); and performing atomic layer deposition to deposit a film on at least a portion of the semiconductor device, where performing atomic layer deposition to deposit the film comprises performing atomic layer deposition to deposit the film on at least a surface of the nanowire (902).

A method as above, where the nanowire comprises a Silicon nanowire or a Carbon nanotube. A method as in any above, where the first structure, the second structure and the nanowire comprise parts of a gate-all-around field effect transistor. A method as in any above, where the first structure, the second structure and the nanowire comprise parts of a field effect transistor, where the first structure comprises a source and the second structure comprises a drain. A method as in any above, where the first structure, the second structure and the nanowire comprise parts of a field effect transistor, where the first structure comprises a Schottky junction source and the second structure comprises a Schottky junction drain. A method as in any above, where the deposited film comprises at least one of Ni, Pt, Co, Ti, Er, Yb, W and Pd.

A method as in any above, where the deposited film comprises a metal, the method further comprising: performing a heat treatment on the semiconductor device to form a layer on at least a portion of the nanowire; and removing any unreacted metal. A method as in any above, where the layer comprises silicide or carbide. A method as in any above, where the layer substantially evenly coats the at least a portion of the nanowire. A method as in any above, where the surface comprises an exposed surface of the nanowire. A method as in any above, where the nanowire is not in direct contact with the substrate and the substrate does not comprise the first structure or the second structure. A method as in any above, where the nanowire comprises a wire-shaped structure having a thickness constrained to tens of nanometers or less. A method as in any above, where the substrate comprises a buried oxide layer overlying a semiconductor layer.

A method as in any above, where the deposited film comprises a metal, where the first structure, the second structure and the nanowire comprise parts of a gate-all-around field effect transistor, where the nanowire is not in direct contact with the substrate and the substrate does not comprise the first structure or the second structure, the method further comprising: performing a heat treatment on the semiconductor device to form a layer on at least a portion of the nanowire and removing any unreacted metal, where the layer comprises silicide or carbide, where the layer substantially evenly coats the at least a portion of the nanowire.

Figure 20:
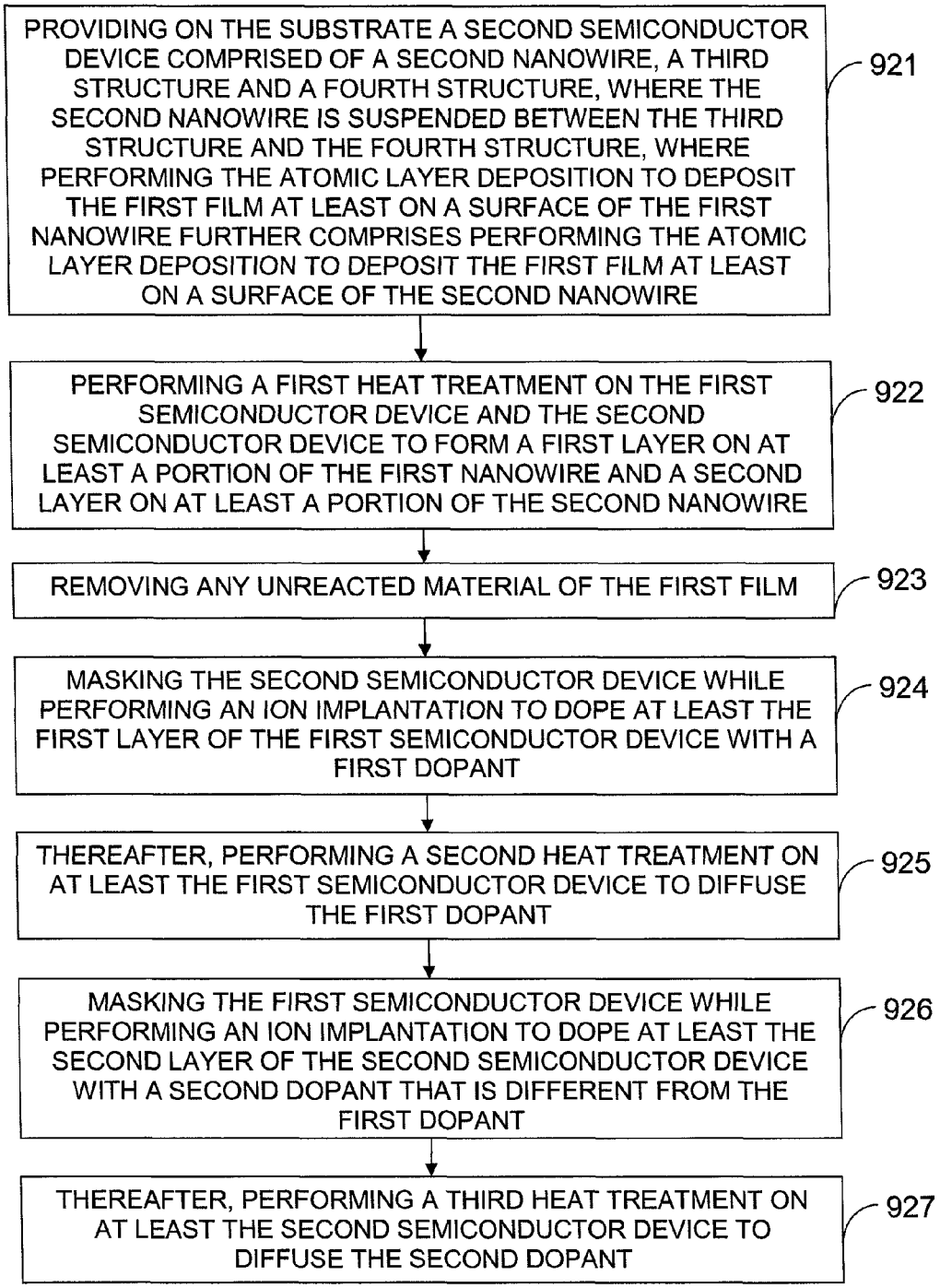
FIG. 20 depicts a flowchart illustrating another non-limiting example of a method for practicing the exemplary embodiments of this invention.

A method as in any above, where the first structure, the second structure and the nanowire comprise parts of a first semiconductor device, where the film comprises a first film, where the nanowire comprises a first nanowire, the method further comprising: providing on the substrate a second semiconductor device comprised of a second nanowire, a third structure and a fourth structure, where the second nanowire is suspended between the third structure and the fourth structure, where performing the atomic layer deposition to deposit the first film at least on a surface of the first nanowire further comprises performing the atomic layer deposition to deposit the first film at least on a surface of the second nanowire (921); performing a first heat treatment on the first semiconductor device and the second semiconductor device to form a first layer on at least a portion of the first nanowire and a second layer on at least a portion of the second nanowire (922); removing any unreacted material of the first film (e.g., using an etch, using a selective wet etch) (923); masking the second semiconductor device while performing an ion implantation to dope at least the first layer of the first semiconductor device with a first dopant (924); thereafter, performing a second heat treatment on at least the first semiconductor device to diffuse the first dopant (e.g., using an anneal, using at least one anneal, using a RTA, using a low temperature anneal, at a temperature less than about 700° C., to diffuse the first dopant to a silicide/carbide-nanowire channel interface, to adjust the Schottky barrier height) (925); masking the first semiconductor device while performing an ion implantation to dope at least the second layer of the second semiconductor device with a second dopant that is different from the first dopant (926); and thereafter, performing a third heat treatment on at least the second semiconductor device to diffuse the second dopant (e.g., using an anneal, using at least one anneal, using a RTA, using a low temperature anneal, at a temperature less than about 700° C., to diffuse the second dopant to a silicide/carbide-nanowire channel interface, to adjust the Schottky barrier height) (927) (see FIG. 20).

Figure 21:
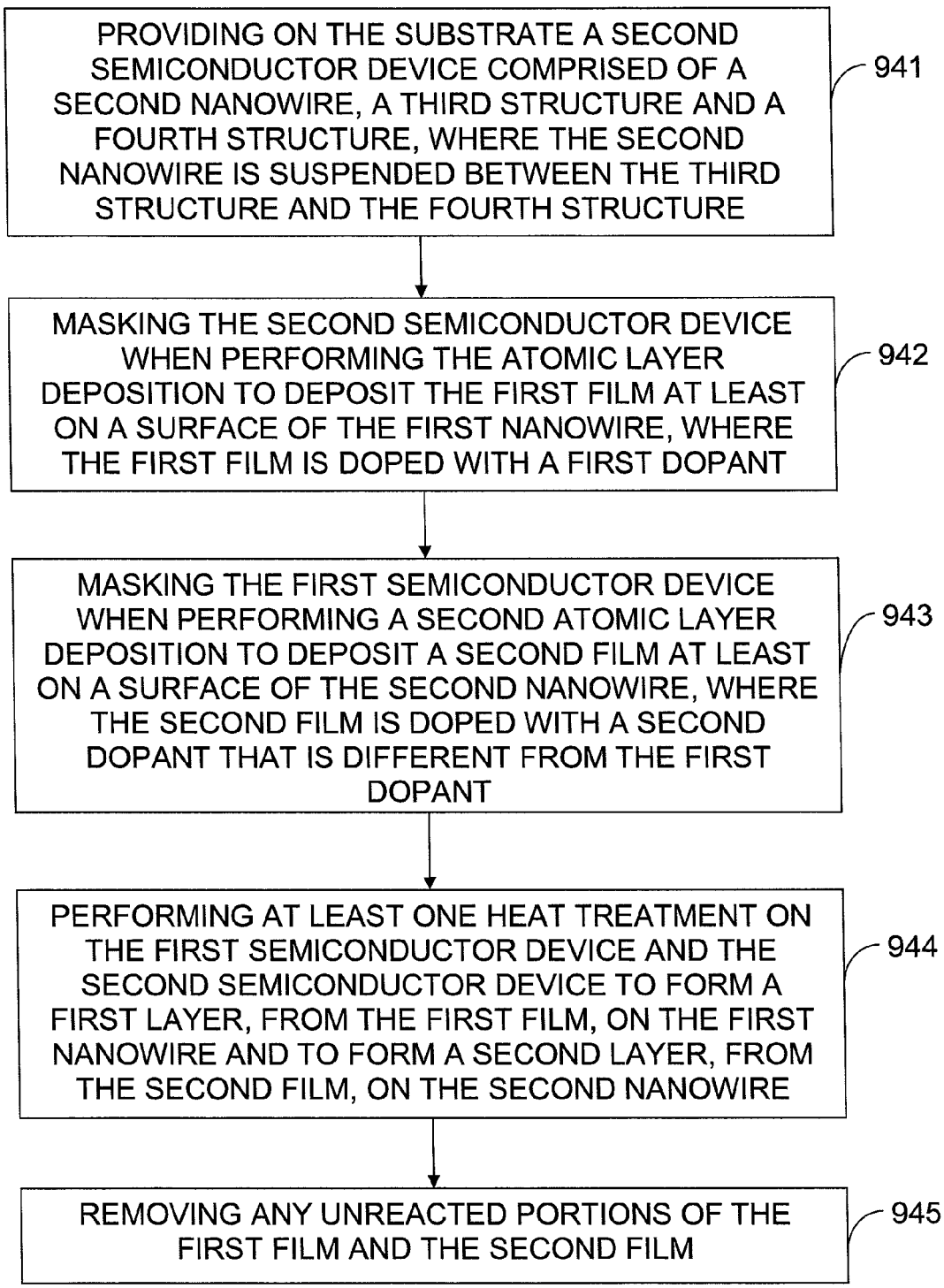
FIG. 21 depicts a flowchart illustrating a further non-limiting example of a method for practicing the exemplary embodiments of this invention.

A method as in any above, where the first structure, the second structure and the nanowire comprise parts of a first semiconductor device, where the layer comprises a first layer, where the nanowire comprises a first nanowire, the method further comprising: providing on the substrate a second semiconductor device comprised of a second nanowire, a third structure and a fourth structure, where the second nanowire is suspended between the third structure and the fourth structure (941); masking the second semiconductor device when performing the atomic layer deposition to deposit the first film at least on a surface of the first nanowire, where the first film is doped with a first dopant (942); masking the first semiconductor device when performing a second atomic layer deposition to deposit a second film at least on a surface of the second nanowire, where the second film is doped with a second dopant that is different from the first dopant (943); performing at least one heat treatment on the first semiconductor device and the second semiconductor device to form a first layer, from the first film, on the first nanowire and to form a second layer, from the second film, on the second nanowire (e.g., using an anneal, using at least one anneal, using a RTA, using a low temperature anneal, at a temperature less than about 700° C., to diffuse the second dopant to a silicide/carbide-nanowire channel interface, to adjust the Schottky barrier height) (944); and removing any unreacted portions of the first film and the second film (e.g., using an etch, using a selective wet etch) (945) (see FIG. 21).

A method as in any above, implemented as a computer program. A method as in any above, implemented as a computer program stored (e.g., tangibly embodied) on a computer-readable medium (e.g., a memory or a program storage device). A method as in any above, implemented as a program of instructions tangibly embodied (e.g., stored) on a program storage device, execution of the program of instructions by a machine (e.g., a processor or a data processor) resulting in operations comprising the steps of the method. A method as in any above, further comprising one or more aspects of the exemplary embodiments of the invention as described herein.

(2) In another exemplary embodiment, a program storage device readable by a machine, tangibly embodying a program of instructions executable by the machine for performing operations, said operations comprising: providing a semiconductor device comprising a substrate, a nanowire, a first structure and a second structure, where the nanowire is suspended between the first structure and the second structure, where the first structure and the second structure overly the substrate (901); and performing atomic layer deposition to deposit a film on at least a portion of the semiconductor device, where performing atomic layer deposition to deposit the film comprises performing atomic layer deposition to deposit the film on at least a surface of the nanowire (902).

A program storage device as in any above, wherein the program storage device comprises a computer-readable medium, a computer-readable memory, a memory, a memory card, a removable memory, a storage device, a storage component and/or a storage circuit. A program storage device as in any above, further comprising one or more aspects of the exemplary embodiments of the invention as described herein.

(3) In a further exemplary embodiment, a semiconductor device comprising a substrate, a nanowire, a first structure and a second structure, where the nanowire is suspended between the first structure and the second structure, where the first structure and the second structure are disposed on a substrate, where the semiconductor structure is formed in accordance with a process comprising: performing atomic layer deposition to deposit a film at least on a surface of the nanowire; and performing a heat treatment on the semiconductor device to form a layer on at least a portion of the nanowire, where the layer comprises silicide or carbide, where the layer substantially evenly coats the at least a portion of the nanowire.

The semiconductor device as above, where the process further comprises: performing a heat treatment (e.g., RTA) on the semiconductor device to form a layer on at least a portion of the nanowire. A semiconductor device as in any above, further comprising one or more aspects of the exemplary embodiments of the invention as described herein.

(4) In another exemplary embodiment, a semiconductor device comprising: a substrate; a nanowire; a first structure; and a second structure, where the nanowire is suspended between the first structure and the second structure, where the first structure and the second structure overly the substrate, where the nanowire comprises a layer on a surface of the nanowire, where the layer comprises at least one of silicide and carbide, where the layer has a substantially uniform shape.

The semiconductor device as above, where the substantially uniform shape comprises a substantially uniform coverage (e.g., no more than about 5-10% variation in thickness for the layer) of the surface of the nanowire (e.g., exposed surface, portion). A semiconductor device as in any above, further comprising one or more aspects of the exemplary embodiments of the invention as described herein.

The exemplary embodiments of the invention, as discussed herein and as particularly described with respect to exemplary methods, may be implemented in conjunction with a program storage device (e.g., at least one memory) readable by a machine, tangibly embodying (e.g., storing) a program of instructions (e.g., a program or computer program) executable by the machine for performing operations. The operations comprise steps of utilizing the exemplary embodiments or steps of the method.

The blocks shown in FIGS. 19-21 further may be considered to correspond to one or more functions and/or operations that are performed by one or more components, circuits, chips, apparatus, processors, computer programs and/or function blocks. Any and/or all of the above may be implemented in any practicable solution or arrangement that enables operation in accordance with the exemplary embodiments of the invention as described herein.

In addition, the arrangement of the blocks depicted in FIGS. 19-21 should be considered merely exemplary and non-limiting. It should be appreciated that the blocks shown in FIGS. 19-21 may correspond to one or more functions and/or operations that may be performed in any order (e.g., any suitable, practicable and/or feasible order) and/or concurrently (e.g., as suitable, practicable and/or feasible) so as to implement one or more of the exemplary embodiments of the invention. In addition, one or more additional functions, operations and/or steps may be utilized in conjunction with those shown in FIGS. 19-21 so as to implement one or more further exemplary embodiments of the invention.

That is, the exemplary embodiments of the invention shown in FIGS. 19-21 may be utilized, implemented or practiced in conjunction with one or more further aspects in any combination (e.g., any combination that is suitable, practicable and/or feasible) and are not limited only to the steps, blocks, operations and/or functions shown in FIGS. 19-21.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

The terminology used herein is for the purpose of describing particular exemplary embodiments only and is not intended to be limiting of the exemplary embodiments of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Unless described otherwise herein, "depositing" may include any now known or later developed techniques appropriate for the material to be deposited, including, but not limited to: chemical vapor deposition (CVD), low-pressure CVD (LPCVD), plasma-enhanced CVD (PECVD), semi-atmosphere CVD (SACVD), high density plasma CVD (HD-PCVD), rapid thermal CVD (RTCVD), ultra-high vacuum CVD (UHVCVD), limited reaction processing CVD (LR-PCVD), metalorganic CVD (MOCVD), sputtering deposition, ion beam deposition, electron beam deposition, laser assisted deposition, thermal oxidation, thermal nitridation, spin-on methods, physical vapor deposition (PVD), ionized PVD, atomic layer deposition (ALD), chemical oxidation, molecular beam epitaxy (MBE), plating or evaporation.

As utilized herein, a substrate may be considered to be any suitable substance upon which and/or from which one or more semiconductor structures and/or devices may be formed. As non-limiting examples, a substrate may comprise one or more of: Si, Ge, SiGe, undoped Si, doped Si, oxide, buried oxide, insulating material, semiconductor material, semiconductor-on-insulator (SOI), Si-on-insulator and/or bulk substrate. As a further non-limiting example, a substrate may consist of (or comprise) an insulator layer (e.g., oxide) overlying a semiconductor layer (e.g., doped or undoped, undoped Si, Si). As another non-limiting example, a substrate may consist of (or comprise) one or more portions of a top semiconductor layer overlying an insulator layer that overlies a bottom semiconductor layer (e.g., SOI).

Any use of the terms "connected," "coupled" or variants thereof should be interpreted to indicate any such connection or coupling, direct or indirect, between the identified elements. As a non-limiting example, one or more intermediate elements may be present between the "coupled" elements. The connection or coupling between the identified elements maybe, as non-limiting examples, physical, electrical, magnetic, logical or any suitable combination thereof in accordance with the described exemplary embodiments. As non-limiting examples, the connection or coupling may comprise one or more printed electrical connections, wires, cables, mediums or any suitable combination thereof.

Generally, various exemplary embodiments of the invention can be implemented in different mediums, such as software, hardware, logic, special purpose circuits or any combination thereof. As a non-limiting example, some aspects may be implemented in software which may be run on a computing device, while other aspects may be implemented in hardware.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments of the invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A method comprising:
   providing a semiconductor device comprising a substrate, a nanowire, a first structure and a second structure, where the nanowire is suspended between the first structure and the second structure, where the first structure and the second structure overlie the substrate; and
   performing atomic layer deposition to deposit a film on at least a portion of the semiconductor device, where performing atomic layer deposition to deposit the film comprises performing atomic layer deposition to deposit the film on at least a surface of the nanowire;
   where the first structure, the second structure and the nanowire comprise parts of a first semiconductor device, where the layer comprises a first layer, where the nanowire comprises a first nanowire, the method further comprising:
   providing on the substrate a second semiconductor device comprised of a second nanowire, a third structure and a fourth structure, where the second nanowire is suspended between the third structure and the fourth structure;
   masking the second semiconductor device when performing the atomic layer deposition to deposit the first film at least on a surface of the first nanowire, where the first film is doped with a first dopant;
   masking the first semiconductor device when performing a second atomic layer deposition to deposit a second film at least on a surface of the second nanowire, where the second film is doped with a second dopant that is different from the first dopant;
   performing at least one heat treatment on the first semiconductor device and the second semiconductor device to form a first layer, from the first film, on the first nanowire and to form a second layer, from the second film, on the second nanowire; and
   removing any unreacted portions of the first film and the second film.

2. The method of claim 1, where the nanowire comprises a Silicon nanowire or a Carbon nanotube.

3. The method of claim 1, where the first structure, the second structure and the nanowire comprise parts of a gate-all-around field effect transistor.

4. The method of claim 1, where the first structure, the second structure and the nanowire comprise parts of a field effect transistor, where the first structure comprises a source and the second structure comprises a drain.

5. The method of claim 1, where the first structure, the second structure and the nanowire comprise parts of a field effect transistor, where the first structure comprises a Schottky junction source and the second structure comprises a Schottky junction drain.

6. The method of claim 1, where the deposited film comprises at least one of Ni, Pt, Co, Ti, Er, Yb, W and Pd.

7. The method of claim 1, where the surface comprises an exposed surface of the nanowire.

8. The method of claim 1, where the nanowire is not in direct contact with the substrate and the substrate does not comprise the first structure or the second structure.

9. The method of claim 1, where the nanowire comprises a wire-shaped structure having a thickness constrained to tens of nanometers or less.

10. The method of claim 1, where the substrate comprises a buried oxide layer overlying a semiconductor layer.

11. The method of claim 1, where the deposited film comprises a metal, where the first structure, the second structure and the nanowire comprise parts of a gate-all-around field effect transistor, where the nanowire is not in direct contact with the substrate and the substrate does not comprise the first structure or the second structure, the method further comprising: performing a heat treatment on the semiconductor device to form a layer on at least a portion of the nanowire and removing any unreacted metal, where the layer comprises silicide or carbide, where the layer substantially evenly coats the at least a portion of the nanowire.

12. The method of claim 1, where the deposited film comprises a metal, the method further comprising:
    performing a heat treatment on the semiconductor device to form a layer on at least a portion of the nanowire; and
    removing any unreacted metal.

13. The method of claim 12, where the layer comprises silicide or carbide.

14. The method of claim 12, where the layer substantially evenly coats the at least a portion of the nanowire.

15. A method comprising:
    providing a semiconductor device comprising a substrate, a nanowire, a first structure and a second structure, where the nanowire is suspended between the first structure and the second structure, where the first structure and the second structure overlie the substrate; and
    performing atomic layer deposition to deposit a film on at least a portion of the semiconductor device, where performing atomic layer deposition to deposit the film comprises performing atomic layer deposition to deposit the film on at least a surface of the nanowire;
    where the first structure, the second structure and the nanowire comprise parts of a first semiconductor device, where the film comprises a first film, where the nanowire comprises a first nanowire, the method further comprising:
    providing on the substrate a second semiconductor device comprised of a second nanowire, a third structure and a fourth structure, where the second nanowire is suspended between the third structure and the fourth structure, where performing the atomic layer deposition to deposit the first film at least on a surface of the first nanowire further comprises performing the atomic layer deposition to deposit the first film at least on a surface of the second nanowire;

performing a first heat treatment on the first semiconductor device and the second semiconductor device to form a first layer on at least a portion of the first nanowire and a second layer on at least a portion of the second nanowire;

removing any unreacted material of the first film;

masking the second semiconductor device while performing an ion implantation to dope at least the first layer of the first semiconductor device with a first dopant;

thereafter, performing a second heat treatment on at least the first semiconductor device to diffuse the first dopant;

masking the first semiconductor device while performing an ion implantation to dope at least the second layer of the second semiconductor device with a second dopant that is different from the first dopant; and thereafter, performing a third heat treatment on at least the second semiconductor device to diffuse the second dopant.

16. The method of claim 15, where the nanowire comprises a Silicon nanowire or a Carbon nanotube.

17. The method of claim 15, where the first structure, the second structure and the nanowire comprise parts of a gate-all-around field effect transistor.

18. The method of claim 15, where the first structure, the second structure and the nanowire comprise parts of a field effect transistor, where the first structure comprises a source and the second structure comprises a drain.

19. The method of claim 15, where the first structure, the second structure and the nanowire comprise parts of a field effect transistor, where the first structure comprises a Schottky junction source and the second structure comprises a Schottky junction drain.

20. The method of claim 15, where the deposited film comprises at least one of Ni, Pt, Co, Ti, Er, Yb, W and Pd.

* * * * *